(12) United States Patent
Harpham et al.

(10) Patent No.: US 8,164,734 B2
(45) Date of Patent: *Apr. 24, 2012

(54) VACUUM SYSTEM FOR IMMERSION PHOTOLITHOGRAPHY

(75) Inventors: Andrew John Harpham, Copthorne (GB); Paul John Shechter, Bolton (GB); Paul Alan Stockman, Hillsborough, NJ (US)

(73) Assignee: ASML Netherlands B.V., Veldhoven (NL)

( * ) Notice: Subject to any disclaimer, the term of this patent is extended or adjusted under 35 U.S.C. 154(b) by 551 days.

This patent is subject to a terminal disclaimer.

(21) Appl. No.: 12/340,326

(22) Filed: Dec. 19, 2008

(65) Prior Publication Data

US 2009/0201471 A1 Aug. 13, 2009

Related U.S. Application Data

(63) Continuation of application No. 10/869,191, filed on Jun. 16, 2004, now Pat. No. 7,481,867.

(51) Int. Cl.
*G03B 27/52* (2006.01)
*G03B 27/42* (2006.01)
(52) U.S. Cl. .......................... 355/30; 355/53
(58) Field of Classification Search .............. 355/30, 355/53; 95/175; 96/156
See application file for complete search history.

(56) References Cited

U.S. PATENT DOCUMENTS

| | | |
|---|---|---|
| 3,314,219 A | 4/1967 | Griffin, III et al. ............ 92/162 |
| 3,573,975 A | 4/1971 | Dhaka et al. |
| 3,648,587 A | 3/1972 | Stevens |
| 3,675,395 A | 7/1972 | Baranowski ............... 96/159 |
| 4,315,760 A | 2/1982 | Bij De Leij ................. 95/24 |
| 4,346,164 A | 8/1982 | Tabarelli et al. |
| 4,390,273 A | 6/1983 | Loebach et al. |
| 4,396,705 A | 8/1983 | Akeyama et al. |
| 4,466,253 A | 8/1984 | Jaster ........................ 62/188 |
| 4,480,910 A | 11/1984 | Takanashi et al. |
| 4,509,852 A | 4/1985 | Tabarelli et al. |
| 4,641,679 A | 2/1987 | Arnaudeau et al. |
| 4,696,684 A | 9/1987 | Shen ........................ 95/266 |

(Continued)

FOREIGN PATENT DOCUMENTS

DD 224448 7/1985

(Continued)

OTHER PUBLICATIONS

Canon KK; Abstract of JP 2002257138 entitled Static Pressure Fluid Bearing Device, Stage Device Using the Same, Exposure Device, and Manufacturing Method for Device, dated Sep. 11, 2002.

(Continued)

*Primary Examiner* — Peter B Kim
(74) *Attorney, Agent, or Firm* — Pillsbury Winthrop Shaw Pittman LLP

(57) ABSTRACT

A vacuum system for extracting a stream of a multi-phase fluid from a photo-lithography tool comprises a pumping arrangement for drawing the fluid from the tool, and an extraction tank located upstream from the pumping arrangement for separating the fluid drawn from the tool into gas and liquid phases. The pumping arrangement comprises a first pump for extracting gas from the tank, and a second pump for extracting liquid from the tank. In order to minimize any pressure fluctuations transmitted from the vacuum system back to the fluid within the tool, a pressure control system maintains a substantially constant pressure in the tank by regulating the amounts of liquid and gas within the tank.

20 Claims, 2 Drawing Sheets

U.S. PATENT DOCUMENTS

| | | | | |
|---|---|---|---|---|
| 4,704,140 | A | 11/1987 | Kujala | 95/19 |
| 4,730,634 | A | 3/1988 | Russell | 95/22 |
| 4,886,530 | A | 12/1989 | Dussourd | |
| 5,040,020 | A | 8/1991 | Rauschenbach et al. | |
| 5,610,683 | A * | 3/1997 | Takahashi | 355/53 |
| 5,715,039 | A | 2/1998 | Fukuda et al. | |
| 5,825,043 | A | 10/1998 | Suwa | |
| 5,900,354 | A | 5/1999 | Batchelder | |
| 6,191,429 | B1 | 2/2001 | Suwa | |
| 6,236,634 | B1 | 5/2001 | Lee et al. | |
| 6,560,032 | B2 | 5/2003 | Hatano | |
| 6,600,547 | B2 | 7/2003 | Watson et al. | |
| 6,603,130 | B1 | 8/2003 | Bisschops et al. | |
| 6,633,365 | B2 | 10/2003 | Suenaga | |
| 6,716,268 | B2 | 4/2004 | Molyneux et al. | 95/22 |
| 6,788,477 | B2 | 9/2004 | Lin | |
| 6,954,256 | B2 | 10/2005 | Flagello et al. | |
| 7,053,983 | B2 | 5/2006 | Tokita | |
| 7,125,438 | B2 | 10/2006 | Skoglund et al. | 95/263 |
| 7,292,313 | B2 | 11/2007 | Poon et al. | |
| 7,379,155 | B2 | 5/2008 | Mertens et al. | |
| 2002/0020821 | A1 | 2/2002 | Van Santen et al. | |
| 2002/0163629 | A1 | 11/2002 | Switkes et al. | |
| 2003/0123040 | A1 | 7/2003 | Almogy | |
| 2003/0174408 | A1 | 9/2003 | Rostalski et al. | |
| 2004/0000627 | A1 | 1/2004 | Schuster | |
| 2004/0021844 | A1 | 2/2004 | Suenaga | |
| 2004/0069330 | A1 | 4/2004 | Rolfson | |
| 2004/0075895 | A1 | 4/2004 | Lin | 359/820 |
| 2004/0109237 | A1 | 6/2004 | Epple et al. | |
| 2004/0114117 | A1 | 6/2004 | Bleeker | |
| 2004/0119954 | A1 | 6/2004 | Kawashima et al. | |
| 2004/0125351 | A1 | 7/2004 | Krautschik | |
| 2004/0135099 | A1 | 7/2004 | Simon et al. | |
| 2004/0136494 | A1 | 7/2004 | Lof et al. | |
| 2004/0154641 | A1 | 8/2004 | Montierth | 134/3 |
| 2004/0160582 | A1 | 8/2004 | De Smit et al. | |
| 2004/0165159 | A1 | 8/2004 | Lof et al. | |
| 2004/0207824 | A1 | 10/2004 | Lof et al. | |
| 2004/0211920 | A1 | 10/2004 | Derksen et al. | |
| 2005/0024609 | A1 | 2/2005 | De Smit et al. | |
| 2005/0048220 | A1 | 3/2005 | Mertens et al. | |
| 2005/0110973 | A1 | 5/2005 | Streefkerk et al. | |
| 2005/0132914 | A1 | 6/2005 | Mulkens et al. | |
| 2005/0134815 | A1 | 6/2005 | Van Santen et al. | |
| 2005/0134817 | A1 | 6/2005 | Nakamura | |
| 2005/0140948 | A1 | 6/2005 | Tokita | |
| 2005/0225734 | A1 | 10/2005 | De Smit et al. | |
| 2006/0038968 | A1 | 2/2006 | Kemper et al. | |
| 2006/0082746 | A1 | 4/2006 | Mertens et al. | |
| 2006/0152697 | A1 | 7/2006 | Poon et al. | |
| 2007/0139628 | A1 | 6/2007 | Nagasaka et al. | 355/30 |
| 2007/0195301 | A1 | 8/2007 | Nagasaka | |
| 2007/0222957 | A1 | 9/2007 | Nagasaka et al. | |
| 2007/0263195 | A1 | 11/2007 | Nagasaka et al. | |
| 2008/0259292 | A1 | 10/2008 | Mertens et al. | |

FOREIGN PATENT DOCUMENTS

| | | |
|---|---|---|
| DD | 242880 | 2/1987 |
| DE | 206 607 | 2/1984 |
| DE | 221 563 | 4/1985 |
| EP | 0023231 | 2/1981 |
| EP | 0418427 | 3/1991 |
| EP | 0 605 103 A1 | 7/1994 |
| EP | 1039511 | 9/2000 |
| EP | 1 486 827 A2 | 12/2004 |
| EP | 1 489 462 A2 | 12/2004 |
| EP | 1 491 957 A2 | 12/2004 |
| EP | 1 528 433 A2 | 5/2005 |
| EP | 1 571 701 | 9/2005 |
| EP | 1 571 701 A1 | 9/2005 |
| FR | 2474708 | 7/1981 |
| JP | 58-202448 | 11/1983 |
| JP | A 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 05-62877 | 3/1993 |
| JP | 06-124873 | 5/1994 |
| JP | 07-132262 | 5/1995 |
| JP | 07-220990 | 8/1995 |
| JP | 08-000907 | 1/1996 |
| JP | A 08-316125 | 11/1996 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2002-257137 A | 9/2002 |
| JP | 2002257138 A | 9/2002 |
| JP | 2004-193252 | 7/2004 |
| JP | 2004-282023 A | 10/2004 |
| JP | A-2004-320016 | 11/2004 |
| JP | A-2004-320017 | 11/2004 |
| JP | 2005-175176 | 6/2005 |
| JP | 2005-191344 | 7/2005 |
| JP | 2005-223315 | 8/2005 |
| JP | 2006-165500 | 6/2006 |
| JP | 2007-504662 | 3/2007 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2005/015315 | 2/2005 |
| WO | WO 2005/024517 | 3/2005 |
| WO | WO 2005/111722 | 11/2005 |
| WO | WO 2005/122221 A1 | 12/2005 |

OTHER PUBLICATIONS

United Kingdom Patent Office Search Report for Application No. GB 0414967.0, dated Oct. 12, 2004.

Communication from the European Patent Office informing of the intention to grant a EP patent for European Patent Application No. 05747245.8, dated Dec. 4, 2009.

U.S. Office Action issued for U.S. Appl. No. 11/642,626, dated Oct. 1, 2008.

English Translation of Notice of Reasons for Rejection for Japanese Patent Application No. 2005-301607, dated Mar. 9, 2009.

Information Disclosure Statement as filed Dec. 21, 2006 for U.S. Appl. No. 11/642,626.

M. Switkes et al., "Immersion Lithography at 157 nm", MIT Lincoln Lab, Orlando Jan. 2001, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

S. Owa and N. Nagasaka, "Potential Performance and Feasibility of Immersion Lithography", NGL Workshop 2003, Jul. 10, 2003, Slide Nos. 1-33.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, J. Microlith., Microfab., Microsyst. 1(1):7-12 (2002).

European Search Report issued for European Patent Application No. 05256461.4-2222 dated Feb. 16, 2006.

Information Disclosure Statement filed Apr. 19, 2007 for U.S. Appl. No. 11/785,722.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

B.W. Smith et al., "Immersion Optical Lithography at 193nm", Future FAB International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

G. Owen et al., "1/8µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

U.S. Office Action issued for U.S. Appl. No. 11/785,722, dated Oct. 25, 2010.

U.S. Office Action issued for U.S. Appl. No. 11/785,722, dated Feb. 4, 2010.

U.S. Office Action issued for U.S. Appl. No. 11/785,722, dated Oct. 14, 2008.

U.S. Office Action issued for U.S. Appl. No. 11/785,722, dated Apr. 17, 2008.

Japanese Office Action mailed Feb. 3, 2011 in related Japanese patent application No. 2007-516020.

Chinese Office Action dated Jun. 29, 2011 in corresponding Chinese Patent Application No. 201010143405.2.

* cited by examiner

VACUUM SYSTEM FOR IMMERSION PHOTOLITHOGRAPHY

The present application is a continuation of co-pending U.S. patent application Ser. No. 10/869,191 filed on Jun. 16, 2004, now allowed, from which benefit is claimed under 35 U.S.C. §120. The entire contents of this application is herein fully incorporated by reference.

FIELD OF THE INVENTION

This invention relates to a vacuum system for extracting a multi-phase fluid, and more particularly for extracting a multi-phase fluid from an immersion photolithography exposure tool.

BACKGROUND OF THE INVENTION

Photolithography is an important process step in semiconductor device fabrication. In photolithography, a circuit design is transferred to a wafer through a pattern imaged onto a photoresist layer deposited on the wafer surface. The wafer then undergoes various etch and deposition processes before a new design is transferred to the wafer surface. This cyclical process continues, building up multiple layers of the semiconductor device.

The minimum feature that may be printed using photolithography is determined by the resolution limit W, which is defined by the Rayleigh equation as:

$$W = \frac{k_1 \lambda}{NA} \quad (1)$$

where $k_1$ is the resolution factor, $\lambda$ is the wavelength of the exposing radiation and NA is the numerical aperture. In lithographic processes used in the manufacture of semiconductor devices, it is therefore advantageous to use radiation of very short wavelength in order to improve optical resolution so that very small features in the device may be accurately reproduced. Monochromatic visible light of various wavelengths have been used, and more recently radiation in the deep ultra violet (DUV) range has been used, including radiation at 193 nm as generated using an ArF excimer laser.

The value of NA is determined by the acceptance angle ($\alpha$) of the lens and the index of refraction (n) of the medium surrounding the lens, and is given by the equation:

$$NA = n \sin \alpha \quad (2)$$

For clean dry air (CDA), the value of n is 1, and so the physical limit to NA for a lithographic technique using CDA as a medium between the lens and the wafer is 1, with the practical limit being currently around 0.9.

Immersion photolithography is a known technique for improving optical resolution by increasing the value of NA. With reference to FIG. 1, in this technique a liquid 10 having a refractive index n>1 is placed between the lower surface of the objective lens 12 of a projection device 14 and the upper surface of a wafer 16 located on a moveable wafer stage 18. The liquid placed between lens 12 and wafer 16 should, ideally, have a low optical absorption at 193 nm, be compatible with the lens material and the photoresist deposited on the wafer surface, and have good uniformity. These criteria are met by ultra-pure, degassed water, which has a refractive index n≈1.44. The increased value of n, in comparison to a technique where the medium between lens and wafer is CDA, increases the value of NA, which in turn decreases the resolution limit W, enabling smaller features to be reproduced.

Due to outgassing from the photoresist layer and the generation of particulates during photolithography, it is desirable to maintain a steady flow of water between the lens 12 and the wafer 16. For example, as described in US 2004/0075895 the lens and wafer could be immersed in a bath of water supported by the wafer stage, with a pump used to recirculate the water within the bath. However, due to the weight of the water bath acting on the wafer stage, this technique is generally considered undesirable.

An alternative technique, as shown in FIG. 1, is to use a nozzle or showerhead device 20 connected to a water source and a vacuum system, shown generally at 22, to produce a localized stream of ultra-pure, degassed water between the lens 12 and the wafer 16. To prevent the ingress of water into other parts of the tool, for example, the mechanism used to move the wafer stage 18, one or more differential air seals 24 are used. As a result, the vacuum system 22 extracts from the tool a multi-phase mixture of water and CDA. However, the extraction of such a multi-phase mixture from the tool using a single vacuum pump, especially in slug or churn regime flows, can generate undesirable pressure and flow fluctuations upstream of the pump, which could be transmitted back to the tool. This could lead to errors in the photolithography process, for example, through variations in the refractive index of the medium located between the lens and the wafer, or through the transmission of mechanical vibrations to the tool.

It is an object of the present invention to provide a vacuum system for extracting a stream of a multi-phase fluid from a photolithography tool and which can minimize any pressure fluctuations imparted thereby to fluid within the tool.

SUMMARY OF THE INVENTION

In a first aspect, the present invention provides a system for extracting a stream of multi-phase fluid from a photo-lithography tool, the system comprising a pumping arrangement for drawing the fluid from the tool, separating means located upstream from the pumping arrangement for separating the fluid drawn from the tool into gas and liquid phases, the pumping arrangement comprising a first pumping unit for extracting gas from the separating means and a second pumping unit for extracting liquid from the separating means, and a pressure control system for controlling the pressure within the separating means by regulating the amounts of gas and liquid therewithin.

In order to minimize any pressure fluctuations transmitted from the system back to the fluid within the tool, the pressure control system can maintain a substantially constant pressure in the separating means by regulating the amounts of liquid and gas within the separating means.

In order to control the amount of gas within the separating means, the pressure control system preferably comprises means for supplying gas to the separating means from a source thereof, and control means for controlling the flow of gas to the separating means. For example, where there is a variation in the flow of fluid into the separating means, and/or a variation in the flow of gas from the separating means, gas can be introduced into the separating means from the external source to compensate for such variations. In a preferred embodiment, the pressure control system comprises a variable flow control device, such as a butterfly or other control valve, through which gas is supplied to the separating means, with the control means being configured to vary the conductance of the valve to control the pressure within the separating means. For example, a controller may be configured to receive a signal indicative of the pressure within the separating means, and to control the conductance of the valve in dependence on the received signal. This signal may be received from a pressure sensor, capacitance manometer or other form of sensor of sufficient sensitivity to achieve the required level of pressure control.

As well as, or as an alternative to, controlling the supply of gas to the separating means, the controller is preferably configured to control the flow of gas from the separating means in dependence on the received signal. For example, another variable flow control device may be provided, through which gas is extracted from the tank by the first pumping unit, with the controller being configured to control the conductance of this variable flow control device.

In order to control the amount of liquid in the separating means, the pressure control system preferably comprises means for supplying liquid to the separating means from a source thereof, and control means for controlling the flow of liquid to the separating means. For example, in order to minimize pressure variations due to the extraction of liquid from the separating means by the second pumping unit, the control means is preferably configured to maintain a substantially constant level of liquid within the separating means. In another preferred embodiment, the liquid supply means comprises a variable flow control device such as a butterfly or other control valve, through which liquid is supplied to the separating means, with the control means being configured to vary the conductance of the valve to control the level of liquid within the separating means. For example, a controller may be configured to receive a signal indicative of the level of liquid within the separating means, and to control the conductance of the valve in dependence on the received signal. This signal may be received from a level meter, float detector, or other form of sensor of sufficient sensitivity to allow a substantially constant level of liquid to be maintained within the separating means.

One or more flexible tubes are preferably used to convey fluid (single and/or multi-phase) between the components of the system. For example, a flexible tube may be used to convey the multi-phase fluid to the separating means. Further flexible tubes may also be used to convey the single phase streams from the separating means to respective pumping units. This can minimize the transmission of vibrations generated during use of the system back to the fluid within the tool.

In another aspect of the present invention, a method is provided for extracting a stream of multi-phase fluid from a photo-lithography tool, the method comprising the steps of: connecting a pumping arrangement to the tool via an extraction tank; operating the pumping arrangement to draw the fluid from the tool; separating the fluid drawn from the tool into gas and liquid phases within the extraction tank, the pumping arrangement extracting separately gas and liquid from the extraction tank; and controlling the pressure within the extraction tank by regulating the amounts of gas and liquid therewithin.

Features described above in relation to system aspects of the invention are equally applicable to method aspects, and vice versa.

DETAILED DESCRIPTION OF THE INVENTION

Figure 1:
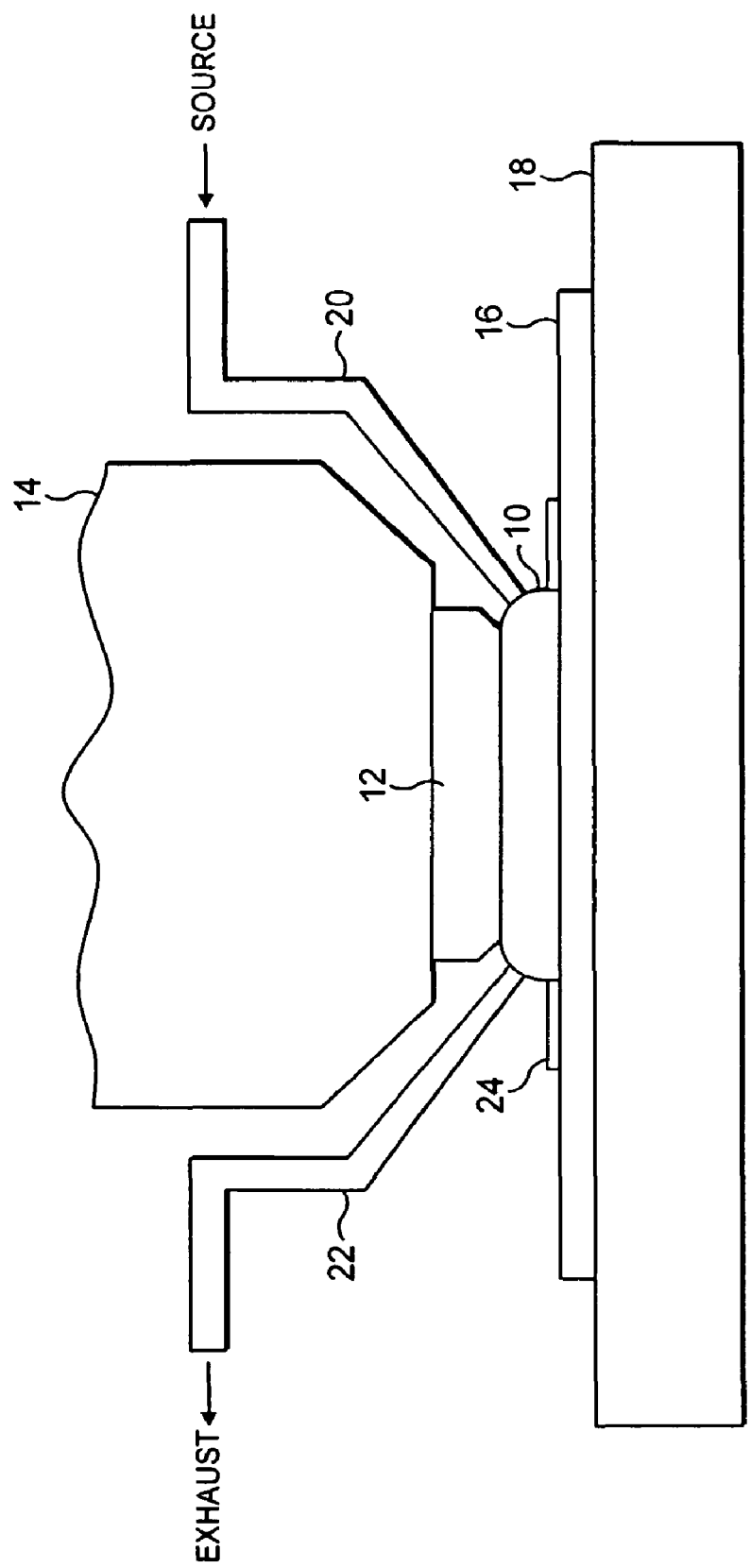
FIG. 1 schematically illustrates a known system for immersion photolithography.
Figure 2:
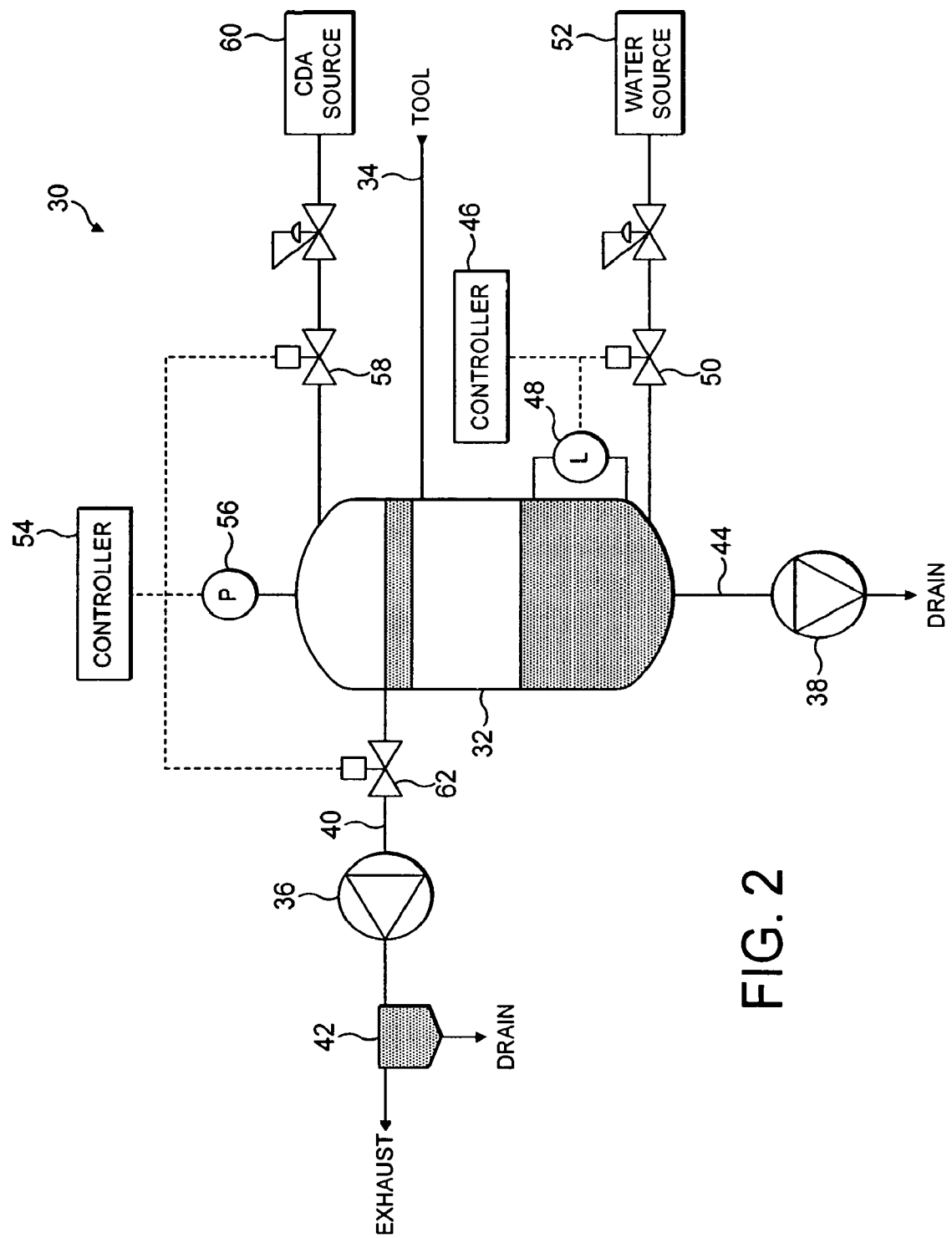
FIG. 2 schematically illustrates the present invention vacuum system for extracting a multi-phase fluid from an immersion photolithography tool.

With reference to FIG. 2, a system 30 for extracting a multi-phase fluid from an immersion photolithography tool comprises a separating means depicted for purposes of illustration as an extraction tank 32 for receiving the multi-stream fluid drawn from the tool by a pumping arrangement located downstream from the tank 32. The tank 32 is connected to the tool by flexible tubing 34 so as to minimize the amount of mechanical coupling between the system 30 and the tool, and thereby minimize the transmission of vibrations generated during use of the system 30 back to the tool.

The tank 32 is configured to separate the liquid and gas phases within the fluid received from the tool. In this example, the fluid received from the tool comprises a mixture of clean dry air (CDA) and ultra-pure water, and so the tank 32 contains any suitable material and/or structure for affecting the separation of the CDA from the water. However, the tank 32 may be configured to separate a different liquid-gas mixture received from the tool. For example, the liquid may comprise an aqueous or non-aqueous solution, and the gas may be other than CDA.

The pumping arrangement comprises a first pumping unit 36 for extracting gas from the tank 32, and a second pumping unit 38 for extracting liquid from the tank 32.

The first pumping unit 36 may comprise any suitable pump for extracting the gas from the tank 32, and is preferably chosen for compatibility with the gas extracted from the tank 32, which is likely to be saturated with liquid vapour, for minimum transmission of pressure fluctuations back to the gas contained in the tank 32, and for relatively long maintenance periods. In this embodiment, the first pumping unit 36 may conveniently comprise an air-powered ejector pump or a water-based liquid ring pump for extracting CDA from the tank 32. In order to inhibit the transfer of vibrations to the tank 32 during use, the first pumping unit 36 is connected to the tank using flexible tubing 40. As the gas exhaust from the first pumping unit 36 may be saturated or supersaturated with liquid vapour, in this embodiment water vapour, a separator vessel 42 may be connected to the exhaust of the first pumping unit 36, the vessel 42 containing any suitable material and/or structure for affecting the separation of water vapour from the CDA. The water extracted from the CDA is exhaust to a drain, and the CDA is vented to the atmosphere.

The second pumping unit 38 may comprise any suitable pump for extracting the liquid from the tank 32, and is preferably chosen for compatibility with the liquid extracted from the tank 32 and for relatively long maintenance periods. In this embodiment where the liquid is water, the second pumping unit 38 may conveniently comprise a water-powered ejector pump or a diaphragm pump for extracting water from the tank 32. In order to inhibit the transfer of vibrations to the tank 32 during use, the second pumping unit 38 is connected to the tank using flexible tubing 44. The internal diameter of the flexible tubing 44 may be chosen to restrict the flow rate of liquid from the tank 32 to the second pumping unit 38. Alternatively, or in addition, a fixed or variable flow restrictor may be located between the tank 32 and the second pumping unit 38.

In order to minimize any pressure fluctuations transmitted from the system 30 back to the fluid within the tool, the system 30 includes a pressure control system to maintain a substantially constant pressure in the tank 32. In this embodiment, this is achieved by regulating the amounts of liquid and gas within the tank 32.

The amount of liquid contained in the tank 32 is maintained at a substantially constant level by a controller 46, thereby maintaining a substantially constant volume of gas in the tank 32. The controller 46 is connected to a sensor 48 for detecting the amount of liquid with the tank 32. The sensor 48 may comprise, for example, a level meter, float meter or other form of suitable sensor. The sensor 48 outputs a signal to the controller 46 indicative of the level of the liquid within the tank 32. In response to this signal, the controller 46 outputs to a variable flow control device 50 located between the tank 32 and a pressurised external liquid source 52 connected to the tank 32 a signal which causes the device 50 to vary the flow of liquid, in this embodiment water, to the tank 32. For example, the device 50 may be a butterfly or other control valve having a conductance that can be varied in dependence on, preferably in proportion to, the signal received from the controller 46. By varying the flow rate of the water to the tank from the external source 52, the controller 46 can compensate for any variation in the flow rate of fluid to the tank 32 from the tool and/or any variation in the rate of extraction of liquid from the tank 32 by the second pumping unit 38, and thus maintain the liquid in the tank 32 at a substantially constant level. The controller 46 may be arranged to process the signal received from the sensor 48 to compensate for any ripples generated in the surface of the liquid during use.

With the gas occupying a substantially constant volume within the tank 32, any variations in the amount of gas contained in the multi-phase fluid received from the tank, and/or any in the rate of extraction of gas from the tank 32 by the first pumping unit 36, and any temperature fluctuations within the tank 32, could vary the pressure of the gas within the tank 32, and impart pressure and flow fluctuations to the fluid in the tool. The pressure control system is therefore configured to maintain a substantially constant pressure within the tank 32 by also regulating the amount of gas within the tank 32.

To achieve this, the pressure control system comprises a controller 54 connected to a sensor 56 for detecting the gas pressure with the tank 32. The sensor 56 may comprise, for example, a pressure sensor, a capacitance manometer or other form of sensor of sufficient sensitivity to achieve the required level of pressure control. The sensor 56 outputs a signal to the controller 54 indicative of the gas pressure within the tank 32. In response to this signal, the controller 54 outputs to a variable flow control device 58 located between the tank 32 and a pressurised external gas source 60 connected to the tank 32 a signal which causes the device 58 to vary the flow of gas, in this embodiment CDA, to the tank 32. A further variable flow control device 62 may be located between the tank 32 and the first pumping unit 36 and configured to receive a signal from the controller 54 to vary the flow of gas from the tank 32. For example, the devices 58, 62 may also be butterfly or other control valves having a conductance that can be varied in dependence on, preferably in proportion to, the signal received from the controller 54. By controlling the flow of gas into and out from the tank 32, the controller 54 can maintain a substantially constant gas pressure within the tank 32.

System 30 provides the capability of extracting a multi-phase fluid from the immersion lithography tool while minimizing any pressure fluctuations imparted thereby to the fluid within the tool.

While the foregoing description and drawings represent the preferred embodiments of the present invention, it will be apparent to those skilled in the art that various changes and modifications may be made therein without departing from the true spirit and scope of the present invention.

The invention claimed is:

1. A lithography apparatus, comprising:
 a projection device configured to project a patterned radiation beam onto a substrate;
 an outlet configured to remove a mixture of liquid and gas; and
 an evacuation system configured to draw the mixture through the outlet, the evacuation system comprising a separator arranged to separate liquid from gas in the removed mixture and a separator pressure controller configured to maintain a substantially stable pressure within the separator.

2. The lithography apparatus of claim 1, further comprising:
 a substrate stage constructed to hold the substrate; and
 an inlet configured to supply liquid to a space between the projection system and a surface facing the projection system,
 wherein the outlet is configured to remove the mixture from the space.

3. The lithography apparatus of claim 1, further comprising a gas supply configured to supply a flow of gas to the separator from a source thereof, and the controller is configured to control the flow of gas to the separator.

4. The lithography apparatus of claim 3, further comprising a liquid supply configured to supply a flow of liquid to the separator from a source thereof, and the controller is configured to control the flow of liquid to the separator.

5. The lithography apparatus of claim 3, wherein the controller is configured to control a flow of gas from the separator to control pressure within the separator.

6. The lithography apparatus of claim 1, further comprising a liquid supply configured to supply a flow of liquid to the separator from a source thereof, and the controller is configured to control the flow of liquid to the separator.

7. The lithography apparatus of claim 1, wherein the controller is configured to control the flow of gas from the separator to control pressure within the separator.

8. The lithography apparatus of claim 1, wherein the controller is configured to maintain the amount of liquid within the separator at a substantially constant level.

9. The lithography apparatus of claim 8, wherein the controller is configured to receive a signal indicative of the level of liquid within the separator to maintain the amount of liquid within the separator at the substantially constant level.

10. A photolithography tool, comprising:
 a projection system configured to project a patterned beam of radiation through liquid onto a radiation-sensitive substrate;
 a separator configured to separate fluid drawn into the separator by a pumping arrangement into gas and liquid phases, the pumping arrangement further comprising a first pump to extract gas from the separator and a second pump to extract liquid from the separator; and
 a pressure control system configured to control pressure within the separator by regulating an amount of gas and/or liquid in the separator.

11. The photolithography tool of claim 10, wherein the pressure control system comprises a gas supply configured to supply a flow of gas to the separator from a source thereof, and a controller configured to control the flow of gas to the separator.

12. The photolithography tool of claim 11, wherein the pressure control system comprises a liquid supply configured to supply a flow of liquid to the separator from a source thereof, and the controller is configured to control the flow of liquid to the separator to control pressure within the separator.

13. The photolithography tool of claim 11, wherein the controller is configured to control a flow of gas from the separator to control pressure within the separator.

14. The photolithography tool of claim 10, wherein the pressure control system comprises a liquid supply configured to supply a flow of liquid to the separator from a source thereof, and the controller is configured to control the flow of liquid to the separator to control pressure within the separator.

15. The lithography apparatus of claim 10, wherein the controller is configured to maintain the amount of liquid within the separator at a substantially constant level.

16. The lithography apparatus of claim 15, wherein the controller is configured to receive a signal indicative of the level of liquid within the separator to maintain the amount of liquid within the separator at the substantially constant level.

17. An apparatus, comprising:
a gas input configured to provide gas under pressure adjacent a space to contain liquid, the space being in the apparatus; and
an evacuation system configured to provide removal of a mixture of liquid and gas coming from the space and to limit the escape of liquid from the space, the evacuation system comprising a separator arranged to separate liquid from gas in the mixture and a separator pressure controller configured to maintain a substantially stable pressure within the separator.

18. A method, comprising:
providing a liquid to a space in a lithography apparatus;
removing a mixture of liquid and gas from the space;
separating liquid from gas in the removed mixture in a separator; and
maintaining a substantially stable pressure within the separator.

19. A method, comprising:
projecting a patterned beam of radiation through liquid onto a radiation-sensitive substrate;
separating fluid, comprising at least some of the liquid, into gas and liquid phases in a separator; and
controlling pressure within the separator by regulating an amount of gas and/or liquid in the separator.

20. A method, comprising:
providing a flow of gas under pressure adjacent a space to contain liquid, the space being in the apparatus;
removing a mixture of liquid and gas coming from the space, the removal limiting the escape of liquid from the space;
separating, in a separator, liquid from gas in the mixture; and
maintaining a substantially stable pressure within the separator.

* * * * *